United States Patent [19]

Ogino

[11] Patent Number: 5,867,435
[45] Date of Patent: Feb. 2, 1999

[54] FAULT REPAIR METHOD FOR A MEMORY DEVICE

[75] Inventor: Junko Ogino, Tokyo, Japan

[73] Assignee: Advantest Corporation, Tokyo, Japan

[21] Appl. No.: 914,212

[22] Filed: Aug. 19, 1997

[30] Foreign Application Priority Data

Aug. 20, 1996 [JP] Japan .................................. 8-218665

[51] Int. Cl.$^6$ .................................................. G11C 7/00
[52] U.S. Cl. ................ 365/200; 365/189.05; 365/230.08
[58] Field of Search .............................. 365/200, 189.05, 365/230.08

[56] References Cited

U.S. PATENT DOCUMENTS

| | | | |
|---|---|---|---|
| 5,544,118 | 8/1996 | Harari | 365/200 X |
| 5,574,684 | 11/1996 | Tomoeda | 365/200 X |
| 5,576,999 | 11/1996 | Kim et al. | 365/200 |

*Primary Examiner*—Do Hyun Yoo
*Attorney, Agent, or Firm*—Oblon, Spivak, McClelland, Maier & Neustadt, P.C.

[57] ABSTRACT

In a repair method for a memory device, a process for determining whether or not repair is possible is first performed, following which processes are carried out for determining whether or not repair of failed lines is possible and whether or not repair of failed bits is possible. It is then determined whether or not a limit exists for a limbo portion, and if a limit exists, failure address connections of spare column portions are extracted from a buffer memory, and a rule check of the limbo portion and an adjustment of repair addresses is carried out in one-block portions for the obtained repair addresses.

4 Claims, 9 Drawing Sheets

FAULT REPAIR METHOD FOR A MEMORY DEVICE

BACKGROUND OF THE INVENTION

1. Field of the Invention

The present invention relates to a repair method for a memory device that repairs failed cells of a memory device by using redundancy of spare rows or spare columns.

2. Description of the Related Art

A fault repair method of a memory device according to the prior art will be explained below with reference to FIGS. 1–4.

First, in Steps 11 and 12, it determined whether or not the device can be repaired based on information on the number of failed cells produced through device measurement. As shown in FIG. 2, the number of lines of spare columns and spare rows is Sc and Sr, respectively; and if the number of cells per row that can be repaired is r and the number of cells per column that can be repaired is c, then the maximum number of failed cells that can be repaired is (Sr×c)+(Sc× r)−(Sr×Sc). If the number of failed cells exceeds this maximum number of repairable failed cells, repair cannot be carried out.

If repair is possible, repair of failed lines is performed in Step 13. As shown in FIG. 3, the number of lines in a spare column and in a spare row is Sc and Sr, respectively, and the number of failed cells at row address r as seen from the column direction is Fr. If Fr>Sc, repair of all of the failed cells at row address r is not possible unless spare rows are used, and accordingly, row address r becomes one repair solution. This check is continued for row addresses and column addresses.

If repair is determined to be possible in Step 13, repair solutions are found, in Step 15, for the remaining failed cells by a round robin approach. Focusing on the repair of one failed cell, if both a spare row and a spare column exist, there are two repair solutions for the failed cell. In dealing with the next failed cell, if both a spare row and spare column exist, the two repair solutions for the preceding failed cell each have a further two repair solutions, for a total of four repair solutions. This approach is applied to all failed cells, and all possibilities are investigated to find the optimum repair solution having the smallest number of spare columns or spare rows. If a repair solution which is capable of repairing all of the failed cells cannot be found, then thr repair is impossible.

FIG. 4 shows repair solutions for a case wherein both the number of spare rows and the number of spare columns are three, and there exist eight failed cells. First looking at failed cell a, there are repair solutions in which a row address of failed cell a is repaired, and a repair solution in which a column address of failed cell a is repaired. Repair solution 1, Repair solution 2, Repair solution 3, and Repair solution 5 are solutions in which a row address of failed cell a is repaired, and Repair solution 4 is a solution in which a column address of failed cell a is repaired.

A repair solution in which a row address of failed cell a is repaired inevitably repairs failed cells b and c. Directing attention now to failed cell d, there are repair solutions in which a row address of failed cell d is repaired and a repair solution in which a column address of failed cell d is repaired. Repair solution 1, Repair solution 2, and Repair solution 3 are solutions in which a row address of failed cell d is repaired, and Repair solution 5 is a solution in which a column address of failed cell d is repaired. Similarly, Repair solution 1, Repair solution 2, and Repair solution 3 are solutions for failed cells g and h in which a row address of failed cell a and a row address of failed cell d are repaired.

According to the repair method of the prior art shown in FIG. 1, when failed cells (indicated by an "x") are present in a memory cell as shown in FIG. 5, the number of repair spare rows is five (their addresses being R1–R5) and the number of repair spare columns is two (their addresses being C1 and C2).

Because there are only four spare rows per block, one row of the five is repaired using the spare row A portion of the neighboring block, as shown in FIG. 6. For example, when the failed cells of addresses R2_R5 are repaired by spare rows of the same block (block 1), and the failed cells of address R1 are repaired using the spare row of the neighboring block, the failed cell of address R1 indicated by a circle cannot be repaired. This is because the spare row B portion (referred to as the "limbo" portion) can only be used to repair a failed cell of a spare column of its own block.

As a consequence, repair of a device cannot be achieved despite replacement by the user of a defective site with a spare cell (spare row) based on a repair solution found by the repair method of the prior art.

SUMMARY OF THE INVENTION

It is an object of the present invention to provide a fault repair method for a memory device that can perform a 100% repair at high speed for redundancy for which the effective range of the spare repair capability is limited.

To achieve the above-described object, the present invention provides a fault repair method for a memory device comprising the steps:

determining whether or not a device can be repaired based on information on the number of failures obtained through device measurement;

if repairable, repairing failed lines;

if repair of failed lines is possible, repairing failed bits; and when there is a limit to a limbo portion that repairs failures among spare columns after completing repair of failed bits, extracting failure address information of spare column portions from a buffer memory, performing a rule check of a limbo portion for obtained repair addresses in one block units and adjusting repair addresses, and preparing file data, which are the results of adjusted repair.

The above-described method enables 100% repair because, when there is a limit to a limbo portion, failure address information of spare column portions is extracted from a buffer memory, a rule check of the limbo portion and an adjustment of repair addresses are performed in one block units for the obtained repair addresses.

According to an embodiment of the present invention, the rule check and repair address check comprising the steps of:

extracting failure addresses in spare column portions of repaired row addresses to a Failure Address Table;

removing, of column addresses in the Failure Address Table, addresses repaired in spare columns from the Failure Address Table;

when the number of repaired lines in rows exceeds the limit of the limbo portion, finding the number of failures in each row address from the Failure Address Table, storing it in a Failure Number Table, and from this Failure Number Table, checking the number of row addresses having more failures than the number of remaining spare columns; and when the number of row addresses does not exceed the limit of the limbo portion, marking row addresses having more failures than the number of remaining spare columns as requiring repair by means of the limbo portion, removing them from the Failure Address Table, and replacing failure addresses remaining in the Failure Address Table by repair in spare columns.

In addition, the limbo portion may be used to repair failures within spare rows.

The above and other objects, features, and advantages of the present invention will become apparent from the following description with references to the accompanying drawings which illustrate examples of the present invention.

DETAILED DESCRIPTION OF THE PREFERRED EMBODIMENT

Figure 1:
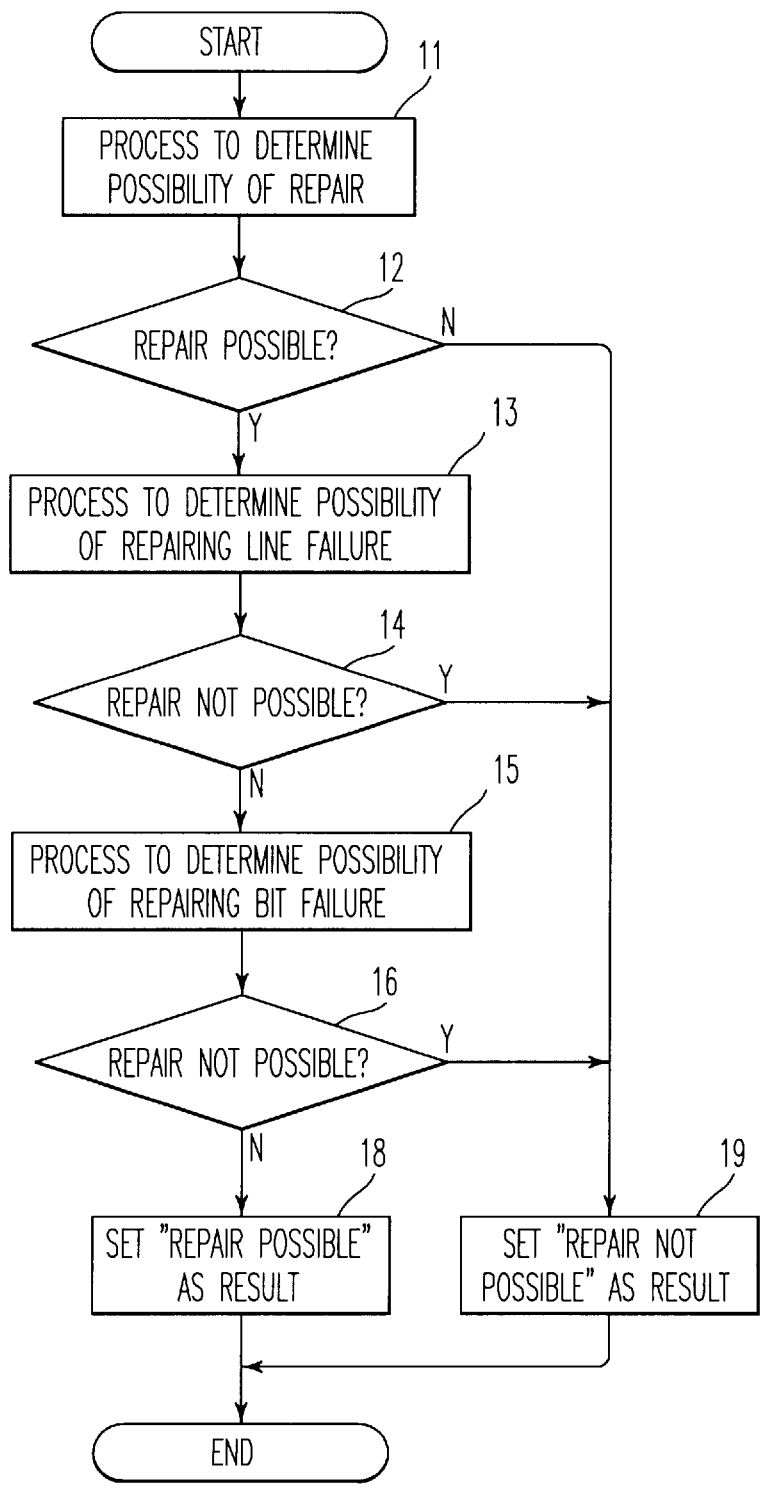
FIG. 1 is a flow chart showing a fault repair method for a memory device according to the prior art.
Figure 2:
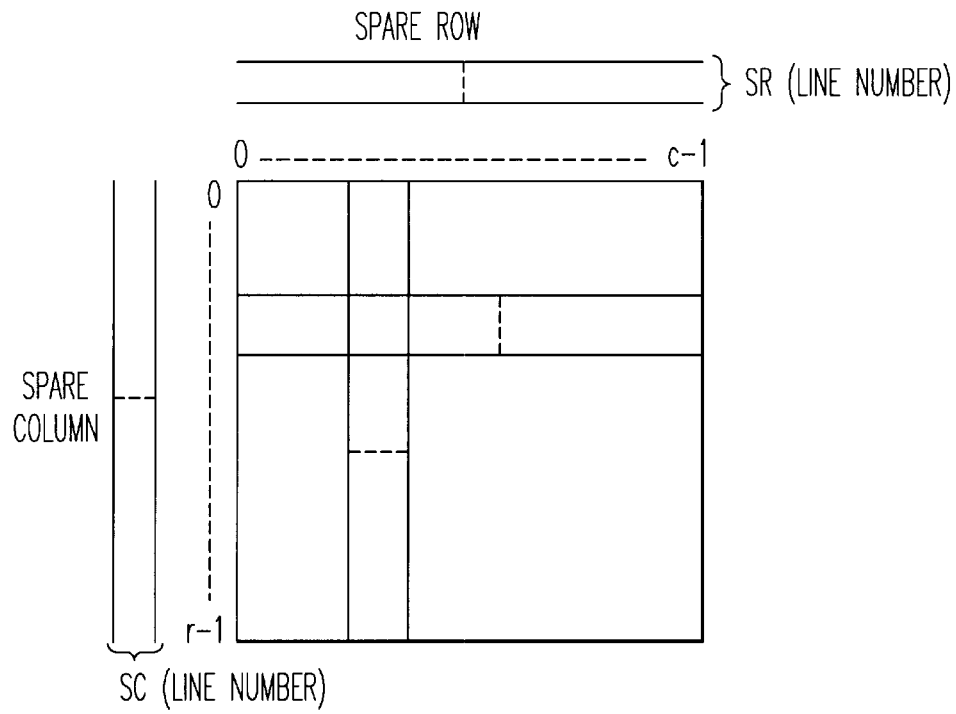
FIG. 2 is an explanatory view of the process of Step 11 in FIG. 1.
Figure 3:
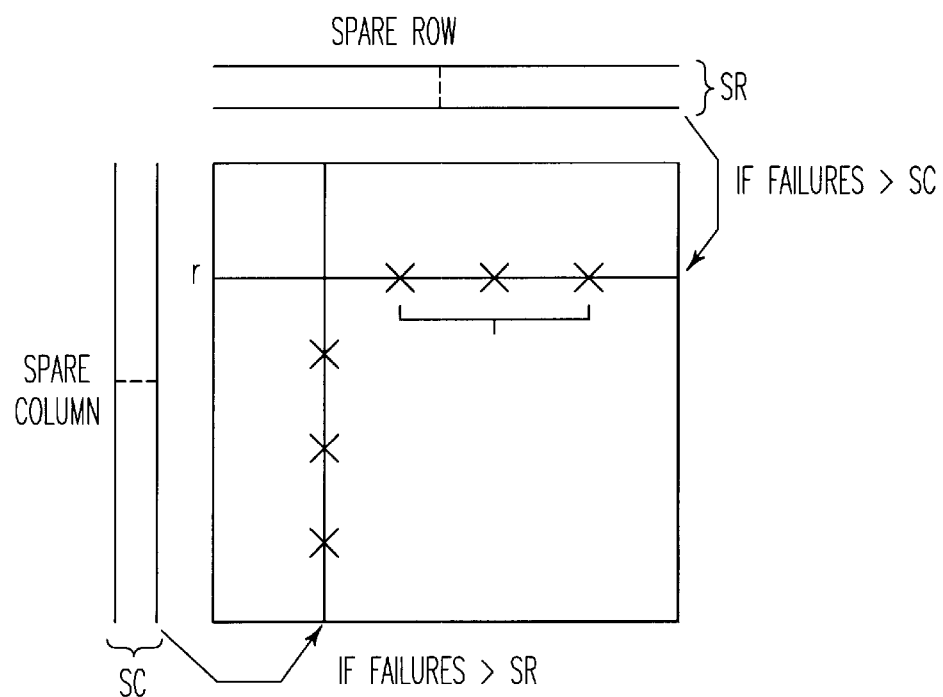
FIG. 3 is an explanatory view of the process of Step 13 in FIG. 1.
Figure 4:
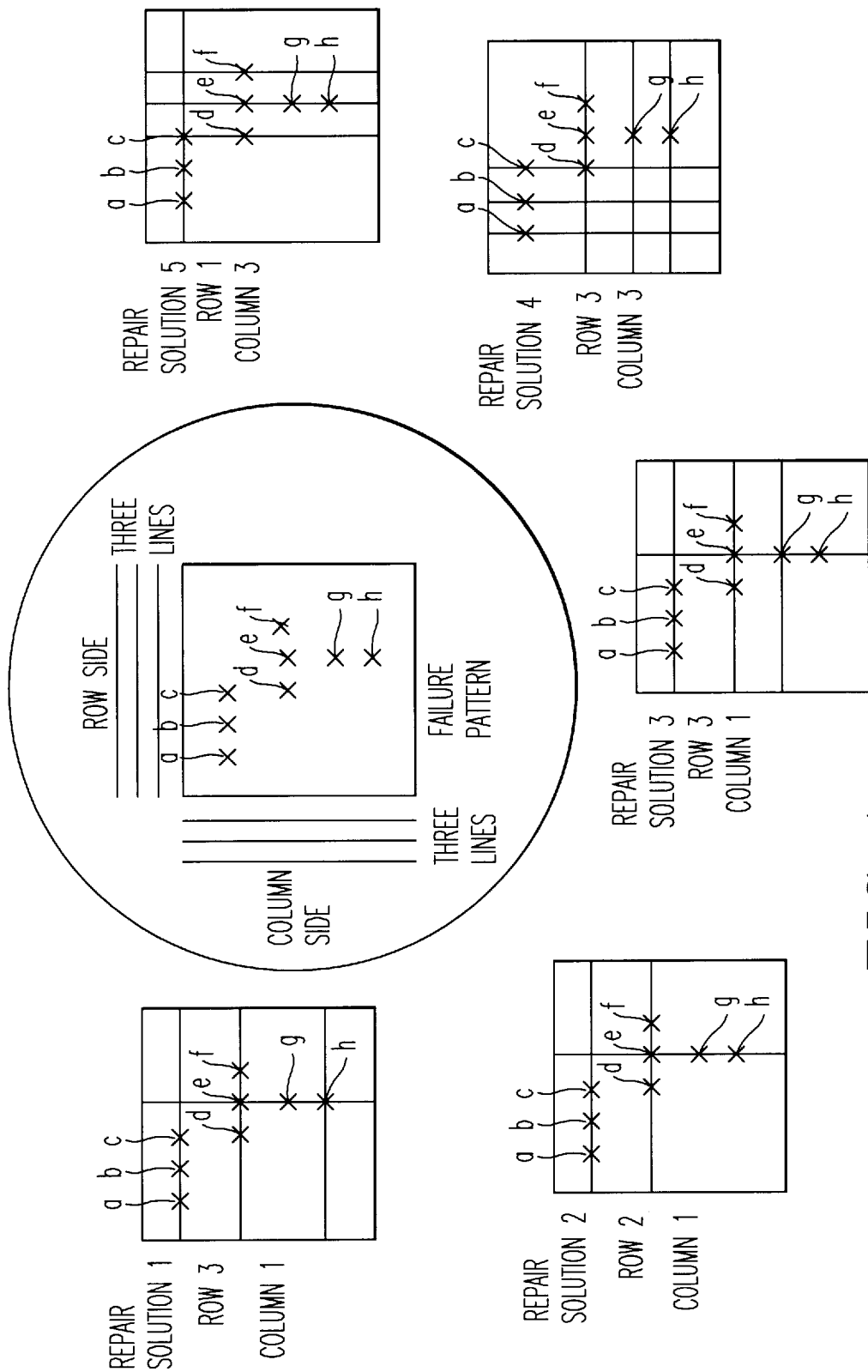
FIG. 4 is an explanatory view of the process of Step 15 in FIG. 1.
Figure 5:
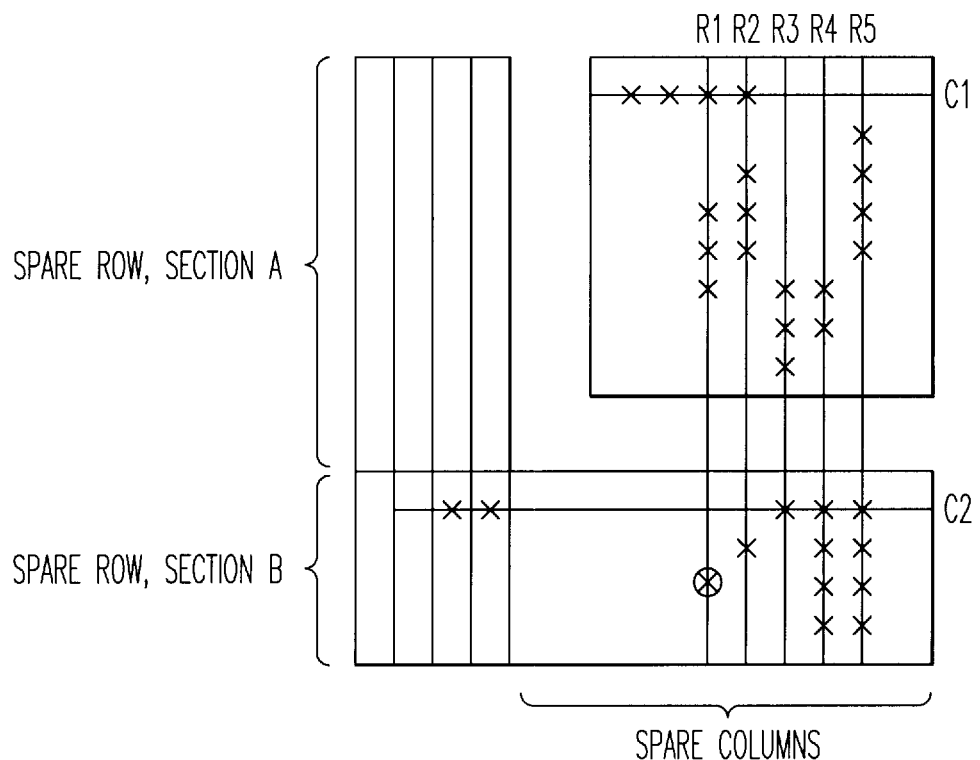
FIG. 5 is a view showing spare rows, spare columns, and the presence of failed cells in a memory device.
Figure 6:
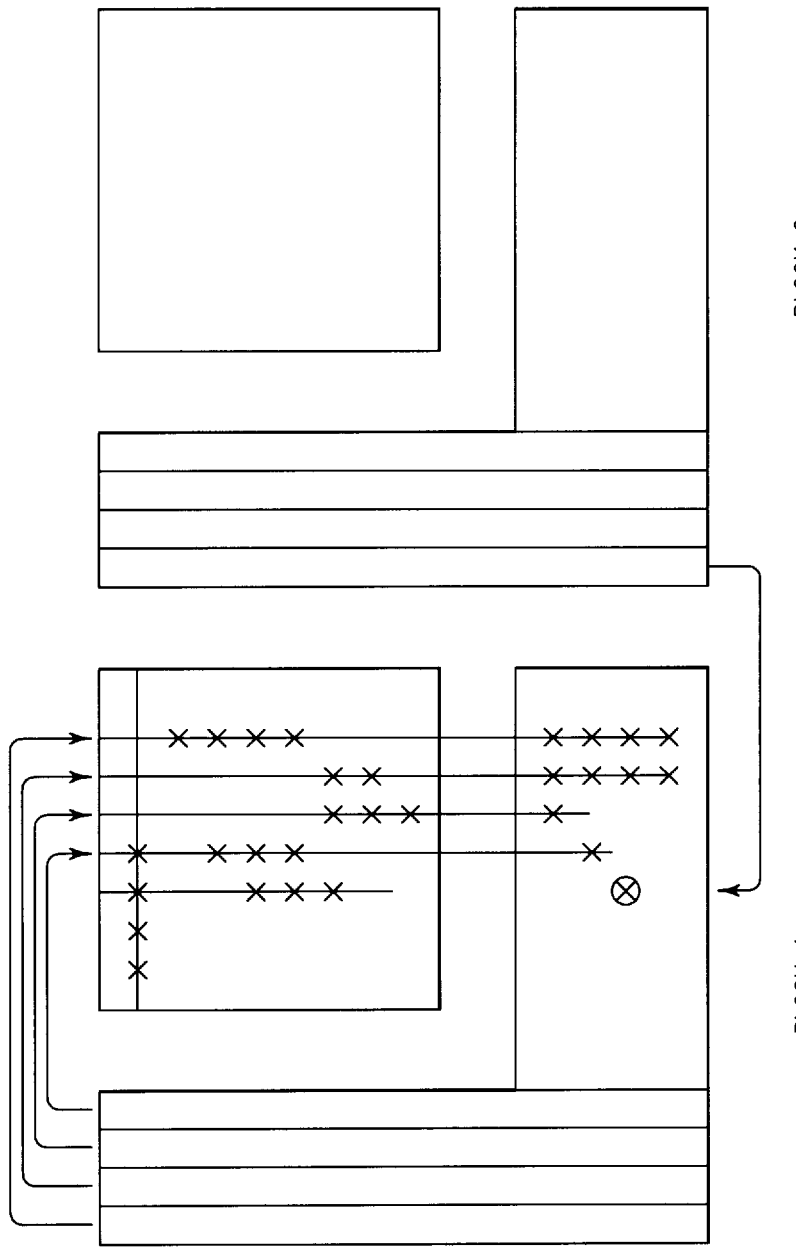
FIG. 6 shows the repair of a failed cell in FIG. 5.
Figure 7:
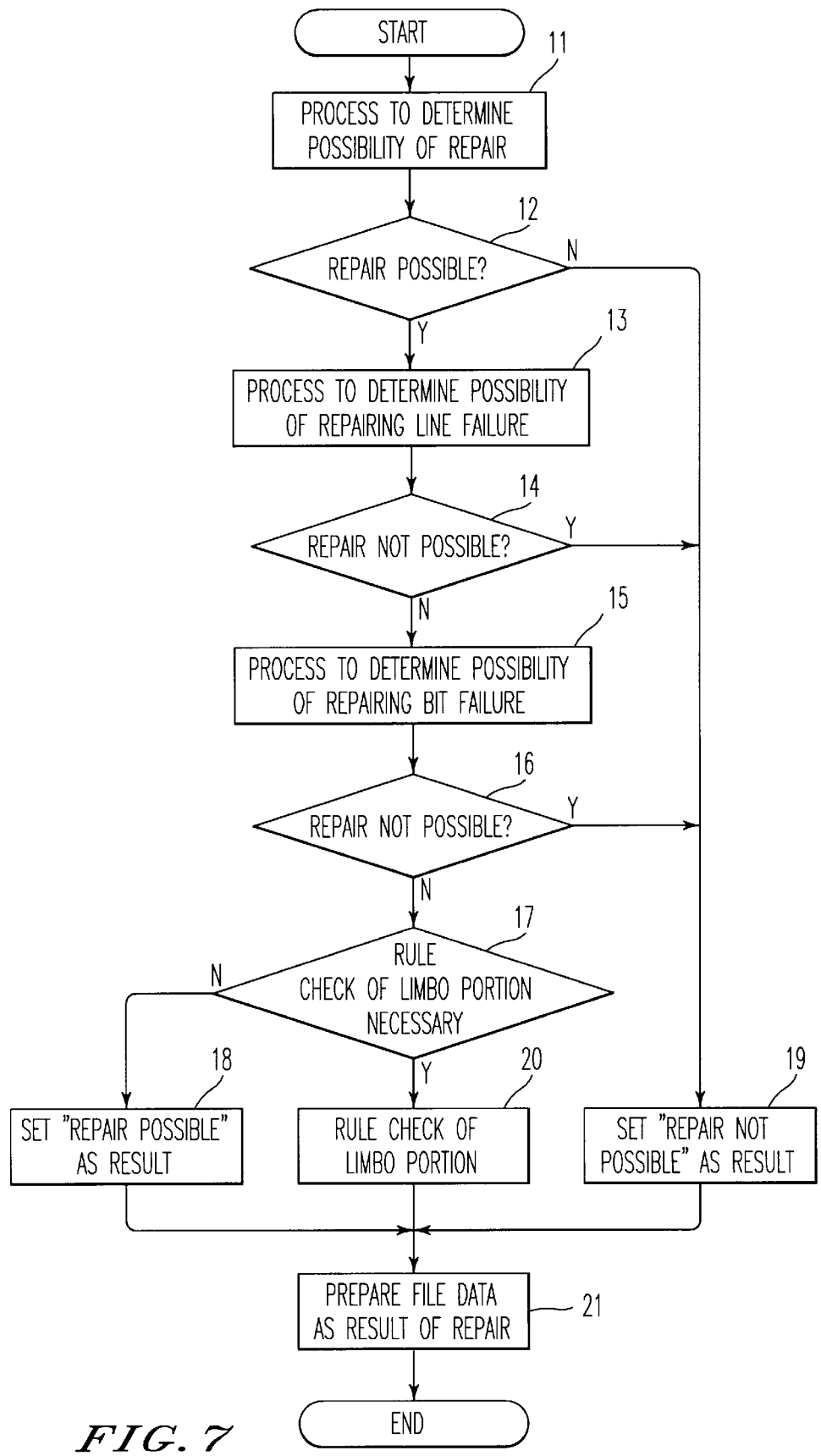
FIG. 7 is a flowchart showing the fault repair method for a memory device according to an embodiment of the present invention.

Referring now to FIG. 7, there is shown a fault repair method according to an embodiment of the present invention. In FIG. 7, reference numerals identical to those of FIG. 1 indicate equivalent processes.

In this embodiment, following Step 16, it is determined in Step 17 whether or not a rule check of the limbo portion is necessary, and if so, the rule check of the limbo portion is performed in Step 20. In Step 21, file data, which are the result of repair, are prepared.

Figure 8:
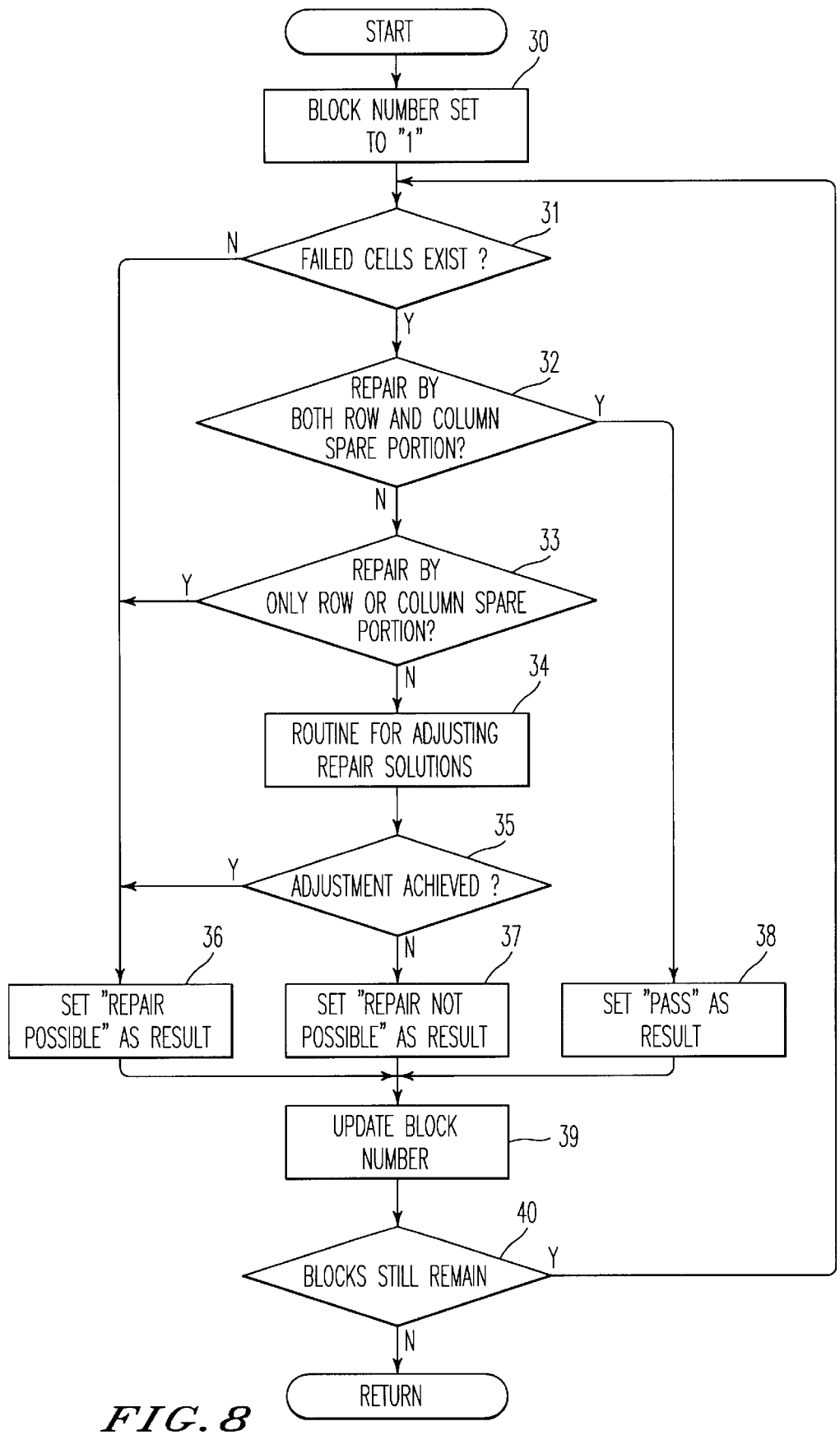
FIG. 8 is a flow chart showing the process of the rule check of the limbo portion in Step 20 in FIG. 7.

FIG. 8 is a flow chart of the rule check of the limbo portion (Step 20). First, in Step 30, the block number is initialized to 1. Next, in Step 31, it is determined whether or not failed cells exist. If no failed cells are present, the result "repair possible" is set in Step 36. If failed cells exist, it is then determined in Step 32 whether repair is for a spare portion of both spare rows and spare columns. If a spare portion is to be repaired, the result "PASS" is set in Step 38. Next, in Step 33, it is determined whether repair is for only a spare row or spare column. If repair is only for a spare row or a spare column, the result "repair possible" is set in Step 36. If repair of a limbo portion is included, the repair solution is adjusted by means of a repair solution adjustment routine in Step 34. In Step 35, it is determined whether or not the adjustment of the repair solution was achieved, and if not achieved, the result "repair not possible" is set in Step 37. In Step 39, the block number is updated, in Step 40 it is determined whether or not blocks remain, and Steps 31 to 40 are repeated until no blocks remain.

Figure 9:
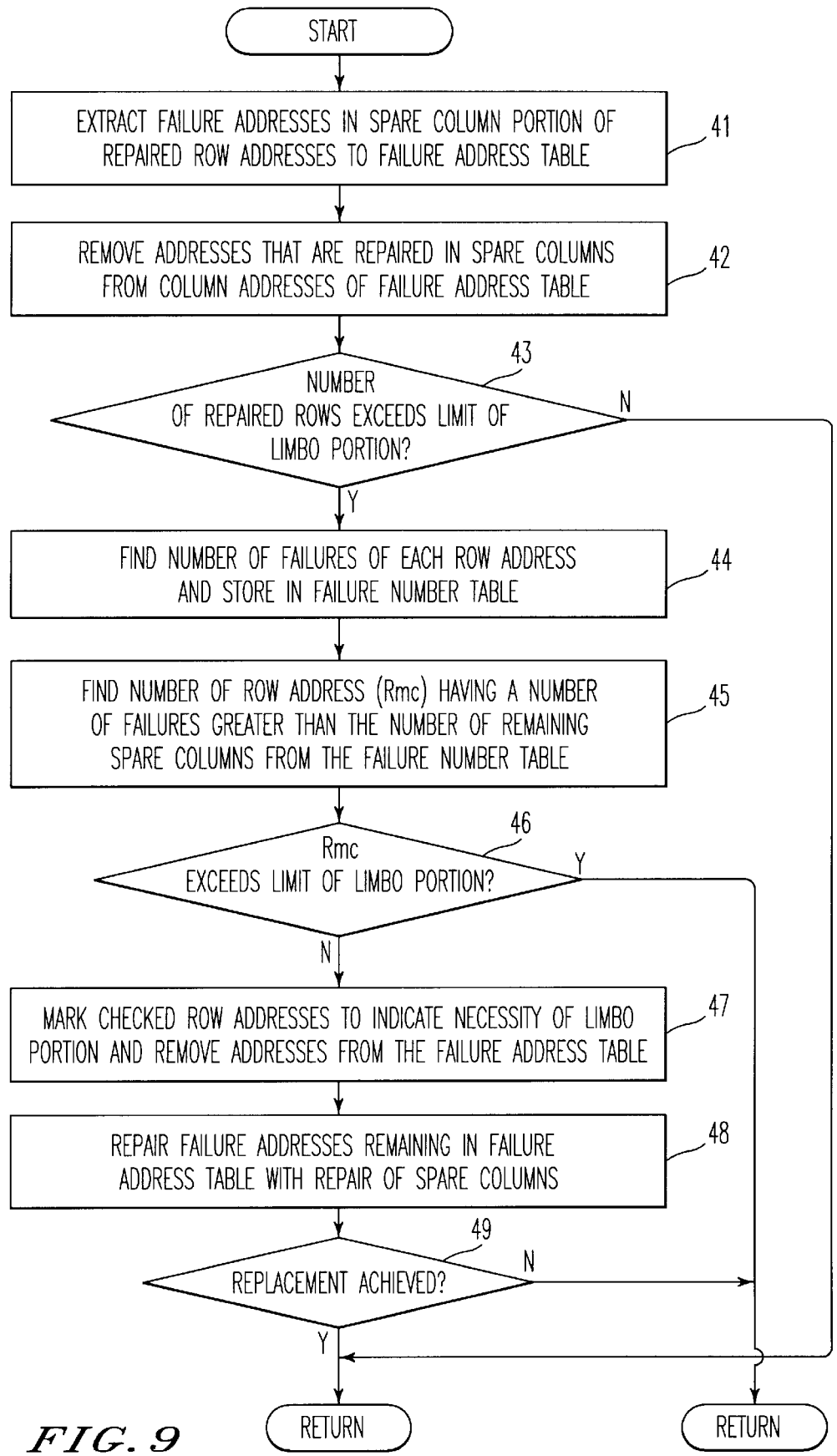
FIG. 9 is a flow chart showing the process of the repair solution adjustment routine 34 in FIG. 8.

FIG. 9 is a flowchart of the repair solution adjustment routine 34. First, failure addresses in the spare column portion of the repaired row addresses are extracted to the Failure Address Table in Step 41. In Step 42, of the column address of Failure Address Table, addresses are next removed that have been repaired in spare columns. In Step 43 it is determined whether or not the number of rows repaired exceeds the limit of the limbo portion. If the limit is not exceeded, the operation returns. If the limit is exceeded, the number of failures of row addresses is found from the Failure Address Table and stored in the Failure Number Table in Step 44. In Step 45, the number of row addresses (Rmc) having a number of failures greater than the number of remaining spare columns is found from the Failure Number Table, and in Step 46, it is determined whether Rmc exceeds the limit of the limbo portion. If the limit is exceeded, the operation returns as "adjustment not possible." If the limit is not exceeded, a mark indicating that a limbo portion is necessary is added to checked row addresses and addresses are removed from the Failure Address Table in Step 47. In Step 48, failure addresses remaining in the Failure Address Table are replaced by repair in spare columns. If replacement is achieved, the operation returns as "adjustment possible," but if replacement is not achieved, the operation is returned as "adjustment not possible."

Figure 10:
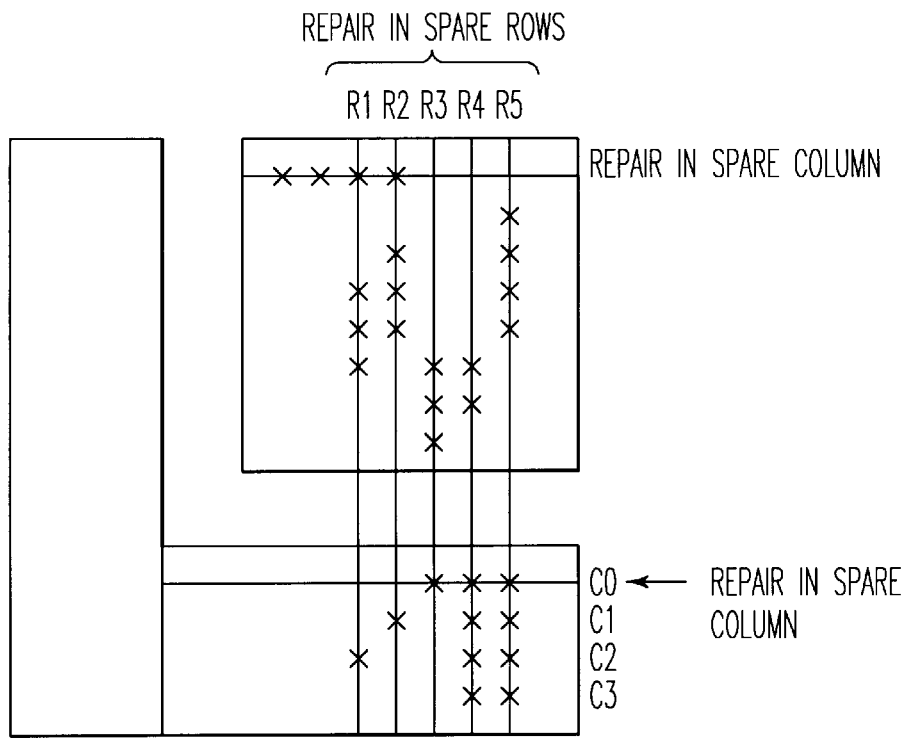
FIG. 10 shows a memory device with spare columns and spare rows before application of the fault repair method of FIG. 7.

FIG. 10 shows an actual example of the processing shown in FIG. 9, and explanation will next be presented for a case in which failed cells are present. The number of spare rows is 4, and the number of remaining spare columns is 2. The process of Step 41 produces the Failure Address Table shown in Table 1.

TABLE 1

| Row Address | Column Address |
|---|---|
| R1 | C2 |
| R2 | C1 |
| R3 | C0 |
| R4 | C0 |
| R4 | C1 |
| R4 | C2 |
| R4 | C3 |
| R5 | C0 |
| R5 | C1 |
| R5 | C2 |
| R5 | C3 |

By the process of Step 42, addresses (R3, C0), (R4, C0), and (R5, C0) repaired in spare columns are removed and the Failure Address Table is as shown in Table 2.

TABLE 2

| Row Address | Column Address |
|---|---|
| R1 | C2 |
| R2 | C1 |
| R4 | C1 |
| R4 | C2 |
| R4 | C3 |
| R5 | C1 |

TABLE 2-continued

| Row Address | Column Address |
| --- | --- |
| R5 | C2 |
| R5 | C3 |

Here, the number of repaired rows (=5) exceeds the limit of the limbo portion (=4), and therefore, when the number of failures of each row address is found in Table 2, the Failure Number Table will be as shown in Table 3.

TABLE 3

| Row Address | Failure Number |
| --- | --- |
| R1 | 1 |
| R2 | 1 |
| R3 | 0 |
| R4 | 3 |
| R5 | 3 |

Accordingly, the number of row address Rmc having more failures than the number of remaining spare columns (=2) is 2.

Row addresses R4 and R5 checked at Rmc are removed from the Failure Address Table, leaving the Failure Address Table as shown in Table 4.

TABLE 4

| Row Address | Column Address |
| --- | --- |
| R1 | C2 |
| R2 | C1 |

Figure 11:
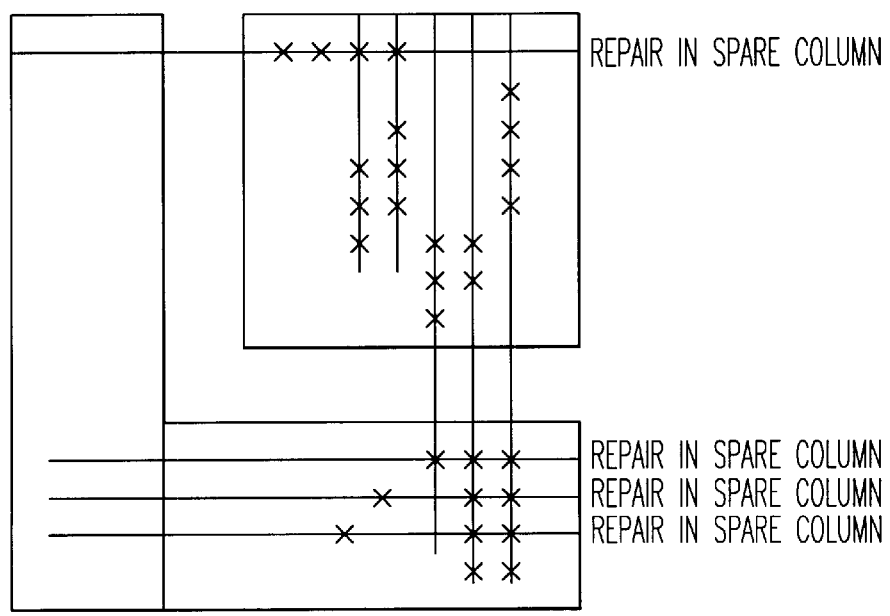
FIG. 11 shows a memory device with spare columns and spare rows following application of the fault repair method of FIG. 7.

The failure addresses (R1, C2) and (R2, C1) remaining in the Failure Address Table are then replaced by repair in spare columns, and the repair result is as shown in FIG. 11. In this way, all of the failed cells are repaired.

While a preferred embodiment of the present invention has been described using specific terms, such description is for illustrative purposes only, and it is to be understood that changes and variations may be made without departing from the spirit or scope of the following claims.

What is claimed is:

1. A fault repair method for a memory device that determines a repair solution for repairing a failure in the memory device using redundant memory of spare rows and spare columns, comprising the steps of:

determining whether the memory device is repairable based on information on a number of failures obtained through device measurement;

determining whether failed lines are repairable when it is determined that the memory device is repairable;

repairing the failed lines when it is determined that the memory device is repairable and that the failed lines are repairable;

repairing failed bits when it is determined that the memory device is repairable and that the failed lines are repairable; and when there is a limit to a limbo portion that repairs failures among the spare columns after completing repair of the failed bits, extracting failure address information of spare column portions from a buffer memory, performing a rule check of the limbo portion for obtaining repair addresses in one block units and adjusting the repair addresses, and preparing file data, which are results of the step of adjusting the repair addresses.

2. A fault repair method for a memory device according to claim 1, wherein said step of performing a rule check and said step of adjusting the repair addresses comprise the steps of:

storing in a Failure Address Table addresses of failed cells in spare columns that have been repaired by spare rows and have that same row addresses as those of failed cells in the memory device;

removing from said Failure Address Table addresses of columns that have been repaired by spare columns from said Failure Address Table;

when a number of repaired lines in rows exceeds the limit of the limbo portion, determining a number of failures in each row address from said Failure Address Table, storing said number of failures in each row address in a Failure Number Table, and checking in said Failure Number Table a number of row addresses having more failures than a number of remaining spare columns; and when said number of row addresses does not exceed the limit of the limbo portion, marking row addresses having more failures than the number of remaining spare columns as requiring repair by means of said limbo portion, removing said marked row addresses from said Failure Address Table, and repairing failure adddresses remaining in said Failure Address Table by spare columns.

3. A fault repair method for a memory device that determines a repair solution for repairing a failure in the memory device using redundant memory of spare columns and spare rows, comprising the steps of:

determining whether the memory device is repairable based on information on a number of failures obtained through device measurement;

determining whether failed lines are repairable when it is determined that the memory device is repairable;

repairing the failed lines when it is determined that the memory device is repairable and that the failed lines are repairable;

repairing failed bits when it is determined that the memory device is repairable and that the failed lines are repairable; and when there is a limit to a limbo portion that repairs failures among the spare rows after completing repair of the failed bits, extracting failure address information of spare row portions from a buffer memory, performing a rule check of the limbo portion for obtaining repair addresses in one block units and adjusting the repair addresses, and preparing file data, which are results of the step of adjusting the repair addresses.

4. A fault repair method for a memory device according to claim 3, wherein said step of performing a rule check and said step of adjusting the repair addresses comprise the steps of:

storing in a Failure Address Table addresses of failed cells in spare rows that have been repaired by spare columns and have that same column addresses as those of failed cells in the memory device;

removing from said Failure Address Table addresses of rows that have been repaired by spare rows from said Failure Address Table;

when a number of repaired lines in columns exceeds the limit of the limbo portion, determining a number of failures in each column address from said Failure Address Table, storing said number of failures in each column address in a Failure Number Table, and checking in said Failure Number Table a number of column addresses having more failures than a number of remaining spare rows; and when said number of column addresses does not exceed the limit of the limbo portion, marking column addresses having more failures than the number of remaining spare rows as requiring repair by means of said limbo portion, removing said marked column addresses from said Failure Address Table, and repairing failure addresses remaining in said Failure Address Table by spare rows.

* * * * *